SEMICONDUCTOR SIGNAL TRANSLATING DEVICE

Filed Nov. 30, 1949 2 SHEETS—SHEET 1

INVENTOR
W. G. PFANN
BY [signature]
ATTORNEY

INVENTOR
W. G. PFANN
BY
[signature]
ATTORNEY

Patented May 20, 1952 2,597,028

UNITED STATES PATENT OFFICE 2,597,028

SEMICONDUCTOR SIGNAL TRANSLATING DEVICE

William G. Pfann, Chatham, N. J., assignor to Bell Telephone Laboratories, Incorporated, New York, N. Y., a corporation of New York Application November 30, 1949, Serial No. 130,268

15 Claims. (Cl. 175—366)

This invention relates to signal translating devices and more particularly to such devices of the general type described in Patent 2,524,035, granted October 3, 1950 to J. Bardeen and W. H. Brattain.

Devices of the type disclosed in the patent above identified comprise, in general, a body of semiconductive material, for example germanium or silicon, a pair of rectifying connections, termed the emitter and collector, to the body and a third, large area or substantially ohmic connection, designated the base, to the body. The emitter and collector are biased relative to the semiconductive body so that electrical carriers are injected into the body at the emitter and are drawn to the collector; the carriers affect the current in the collector circuit in such manner that amplified replicas of signals impressed upon the emitter are produced in the collector circuit.

Such devices are utilizable for the performance of a variety of functions such as amplification, oscillation generation and modulation. However, there appears to be some limit upon the maximum operating frequency at which useful results may be realized. Also variations in the performance of apparently similar devices have been observed.

One general object of this invention is to improve the operating characteristics of semiconductor signal translating devices of the general type above described.

More specific objects of this invention are to increase the operating frequency range of such devices, to improve the uniformity of performance of like devices, to facilitate the construction of such devices, and to enlarge the fields of application of semiconductor signal translating devices.

The operation of devices of the type comprehended by the invention involves, as noted heretofore, the injection of electrical carriers, electrons or holes, at the emitter and the flow thereof to the collector. There are, of course, a multiplicity of paths that the carriers may take with a consequent spread in the transit times of the carriers from emitter to collector. The limitations upon the high frequency operation of the devices are ascribable, in substantial part to this factor, for it is evident that for carriers following paths of substantially different lengths, out of phase effects may obtain at and in the vicinity of the collector. Further, the carriers have certain lifetimes associated with recombination with carriers of opposite polarity present in the body. Because of the variety of possible paths of flow, recombination effects may vary from device to device with consequent differences in the performance characteristics of the several devices.

In accordance with one feature of this invention, the flow of carriers from emitter to collector is constrained to paths within close prescribed boundaries whereby substantially equal transit times and uniform recombination effects are assured. Thus, the operating frequency range is extended and uniformity of operating characteristics is realized.

More specifically, in accordance with one feature of this invention and in an illustrative construction, there is provided in a body of semiconductive material a thin strip or restricted zone of conductivity or conductivity type different from the mass of the body. Because of the difference in conductivities, the boundaries of the strip or zone are of a character to prevent passage of the carriers beyond these boundaries. The emitter and collector are connected to the strip or zone. The base connection is made to the body, advantageously contacting the strip or zone. Thus, in effect, the carriers are confined to channels of very small prescribed transverse dimensions extending from the emitter to the collector.

Advantageously, the conductivity of the strip or zone is lower than that of the body and the ratio of the two conductivities is as large as practical. In an illustrative device comprising an N-type channel or zone in an N-type body, the resistivity of the former may be of the order of 10 ohm centimeters and the resistivity of the body may be of the order of 0.01 ohm centimeter or less, to provide a ratio of about 1000 or greater. In another illustrative device including a P-type zone or channel in an N-type body, the ratio may be somewhat lower, the resistivity being of the order of 10 ohm centimeters for the zone and of the order of 0.1 ohm centimeter or less for the body.

In another illustrative construction or embodiment, the strips or zones may be formed with branches whereby, for example, carriers from two emitters may be directed to a common collector, or carriers from one emitter may be directed selectively to any one of two or more collectors.

The invention and the above noted and other features thereof will be understood more clearly and fully from the following detailed description with reference to the accompanying drawing, in which.

Figure 1:
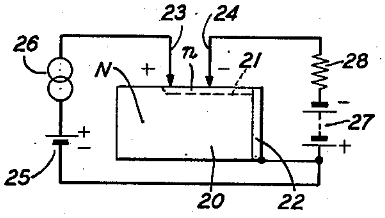
Fig. 1 is in part an elevational view of the semiconductive body and in part a circuit schematic showing a translating device illustrative of one embodiment of the invention.

In the drawing, in the interest of clarity of illustration, the semiconductive bodies have been shown to a greatly enlarged scale. The magnitude of the exaggeration will be apparent from consideration of dimensions in typical devices. For example, in a device of the construction illustrated in Figs. 1 and 2, the semiconductive body may be .050 inch long by .050 inch wide by .020 inch thick and the strip or zone may be .001 inch wide .001 inch thick.

Semiconductive materials particularly suitable for use in devices constructed in accordance with this invention are germanium and silicon having traces of significant impurities therein. Suitable germanium may be produced as in the manner disclosed in the application Serial No. 638,351 filed December 29, 1945 of J. H. Scaff and H. C. Theuerer; suitable silicon may be prepared in the manner disclosed in Patents 2,402,661 and 2,402,662, granted June 25, 1946, to R. S. Ohl. These materials, as is known, may be of either of two distinct or opposite conductivity types, designated P and N, the P material exhibiting low resistance to current flow to a metallic connection thereto when it is positive relative to the connection and the N material exhibiting such low resistance when it is negative with respect to the connection. As is also known, the conductivity type may be determined by the relative amounts of acceptor and donor atoms in the material, P-type conductivity being associated with an excess of acceptors and N-type conductivity being associated with an excess of donors.

Further, there are gradations within each conductivity type depending upon the magnitude of the excess of acceptors or donors. Thus, for example, a material may be strongly N type when it contains a large excess of donors and weakly N type if it contains a relatively small excess of donors. The magnitude of the excess determines the specific electrical characteristics such as the specific conductivity and the peak back voltage as used in rectifiers. For example, for germanium having a resistivity of 5 ohm centimeters the concentration of excess donors is about $1\times10^{15}$/cc. whereas for germanium having a resistivity of 0.05 ohm centimeter the concentration of excess donors is about $1\times10^{17}$/cc.

Material of one conductivity type may be converted to the opposite conductivity type in several ways, for example by heat treatment as disclosed in the application of Scaff and Theuerer identified hereinabove or by nuclear bombardment as disclosed in the application Serial No. 89,969, filed April 27, 1949 of W. Shockley. Gradations in each conductivity type may be produced in like manner. Also, changes in conductivity type or gradations within each type may be effected by alteration of the acceptor-donor ratio through the diffusion of an appropriate impuritiy into the material. Thus, strong N-type germanium may be converted to P-type or weakly N-type by diffusion of an acceptor impurity, for example aluminum, into one face of the material. In like manner, a zone of P-type or weakly N-type may be produced in one surface portion of a body of strongly N material by confining the diffusion to a desired area or volume. Strongly P-type germanium material may be converted to weakly P-type or to N-type, or zones of weak P type or of N type may be produced in a body of P type material, by diffusion of a donor impurity, for example phosphorous, antimony or arsenic, into the material or restricted zones thereof.

One specific method of producing a low conductivity strip or zone in a body of high conductivity N-type germanium is as follows: A mask having therein an aperture of dimensions corresponding to those of the strip or zone is placed upon one face of the body and gold is deposited upon the exposed area of this face through the aperture in the mask. This may be effected by vapor deposition of the gold in a vacuum of the order of $10^{-5}$ millimeters of mercury. The deposited gold may be of the order of 1 milligram per square inch. The body with the deposited gold thereon then is heated for about five hours at about 500° C. in hydrogen, whereby the gold diffuses into the germanium. Following this, excess gold is removed from the face mentioned, as by polishing on a cloth with 600 mesh alundum or by grinding.

This method will produce a low conductivity N-type zone or a P-type zone in the surface portion of the body, the conductivity type depending upon the initial resistivity of the body and the temperature of the diffusion treatment. In general, the higher this temperature the greater is the gold diffusion and the lower the N-type conductivity of the resulting strip or zone.

In the drawing, relatively high conductivity N-type material is designated by the letter N and relatively low conductivity material is designated by the letter *n*. P conductivity type material is designated by the letter P.

Figure 2A:
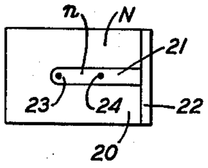
Fig. 2A is a plan view of the semiconductive body shown in Fig. 1.

Referring now to the drawing, the signal translating device illustrated in Figs. 1 and 2*a* comprises a body of N-type semiconductive material 20, having in one face portion thereof a restricted zone 21 of this material of lower conductivity than the body 20. A base electrode 22, for example a coating of copper or rhodium, is provided on one end of the body 20. Emitter and collector connections 23 and 24, respectively, for example point contacts of phosphor bronze, bear against the zone 21 in proximity to one another, for example, spaced in the order of .002''. The emitter 23 is biased in the forward direction relative to the base 22 by a suitable source 25 in series with a signal source 26. The collector 24 is biased in the reverse or high impedance direction relative to the base 22 by a source 27, which has in series therewith a load represented generally by the resistor 28.

Figures 3A, 3B:
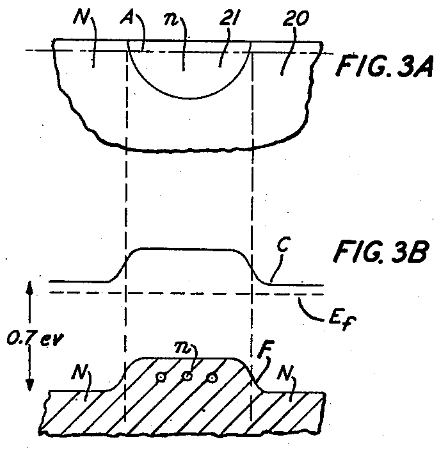
Figs. 3A and 3B are diagrams illustrating the energy contours at and adjacent the boundaries of the strip or zone in the semiconductive body shown in Figs. 1 and 2.

In the operation of the device, signals are impressed between the emitter 23 and base 22 and amplified replicas thereof appear in the load 28. When the body 20 and the zone 21 are of N conductivity type material, holes are injected at the emitter into the zone 21 and flow to the collector 24. Because of the difference in conductivities of zone 21 and the body 20, the energy levels at the junction of the body and zone are such that the holes are constrained to flow only in the zone 21. This will be appreciated from a consideration of energy level contours as illustrated in 3B for a cross section of the body as shown in Fig. 3A. Specifically, in Fig. 3B the horizontal dotted line $E_f$ represents the Fermi level, the line C represents the bottom of the conduction band and the line F represents the top of the filled band. For germanium the energy gap between the boundaries C and F is substantially 0.7 electron volts. For silicon this gap is of the order of 1.2 electron volts. Strictly the energy contours as depicted in Fig. 3B hold only at and in the immediate vicinity of the surface of the relatively low conductivity zone 21, in the region of line A in Fig. 3A, although throughout the barrier between this zone and the body the contours are of generally similar configuration. As is understood, in diagrams such as that of Fig. 3B holes tend to rise and electrons seek lower levels. Injected holes in the *n* channel are depicted by the circles in the zone in Fig. 3B. It is evident from the contours of the energy levels as depicted in Fig. 3B that a hole in the zone 21 will be constrained to flow in this zone because of the slope at the contours at the junction between the zone 21 and the body 20.

Because of the constraint upon the possible paths of flow of the holes, it will be appreciated that paths of substantially the same length for holes passing from the emitter to the collector obtain. Thus, spread in hole transit times is minimized, and recombination effects are made uniform.

Figure 2B:
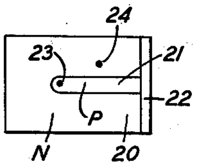
Fig. 2B is a plan view similar to Fig. 2A illustrating another embodiment of this invention.

Although in the embodiment of the invention illustrated in Figs. 1 and 2*a* both the body 20 and the zone 21 are of N conductivity type material, as illustrated in Fig. 2B the zone 21 may be a P conductivity type material. In this case and as illustrated in Fig. 2B, the emitter 23 bears against the zone whereas the collector 24 bears against the N type body in immediate proximity to the PN junction between the zone and body. Advantageously the P-type zone is but weakly P-type material, that is the concentration of excess acceptors is low so that holes will be injected into the zone 21. The collector 24 which bears against N-type material interacts with the PN barrier or junction in immediate proximity thereto to produce large values of the current multiplication factor.

Figure 4:
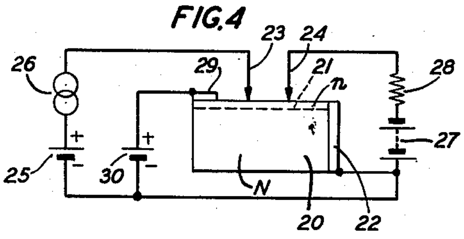
Fig. 4 illustrates a modification of the device shown in Fig. 1.

The invention may be embodied also in devices of the general type disclosed in the application Serial No. 50,894 filed September 24, 1948 of J. R. Haynes and W. Shockley wherein an additional electric field is utilized to control the transit times of the holes flowing from the emitter to the collector. An illustrative construction is shown in Fig. 4 wherein the zone 21 extends between opposite ends of the body 20 and an auxiliary electrode or substantially ohmic connection 29 is made to this zone. This connection 29 is biased as by a source 30 at such polarity so as to accelerate holes injected at the emitter 23 toward the collector 24.

Figure 5:
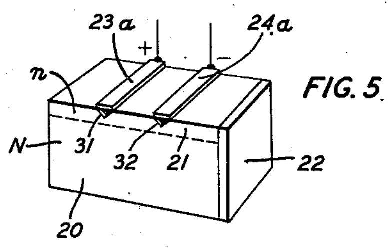
Figs. 5 and 6 are perspective views of semiconductor translating devices illustrative of other embodiments of the invention including line contact type emitter and collector connections.

In the embodiment of this invention illustrated in Fig. 5, the relatively low conductivity N-type zone 21 may be in the form of a surface layer upon the relatively high conductivity body 20. The emitter and the collector connections are constituted by parallel zones 31 and 32 respectively, of P conductivity type material extending transversely of the zone 21 and having ohmic connections 23*a* and 24*a* thereto. By this construction substantial parallelism of the hole flow from emitter to collector is realized. Because of the difference in conductivities between the zone 21 and the body 20, flow of the carriers is constrained to the zone by virtue of the energy contours at the junction of the zone and body.

Figure 6:
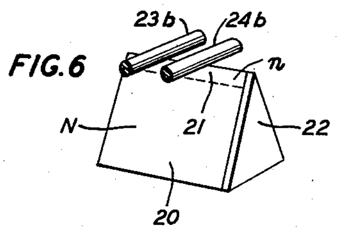

A very high concentration of the carrier paths between the emitter and the collector may be realized also as illustrated in Fig. 6 by forming the zone 21 in one corner of a triangular prism 20 of relatively high conductivity material. The emitter and collector connections are made by very fine wires 23*b* and 24*b* bearing against the edge of the zone 21.

Figure 7:
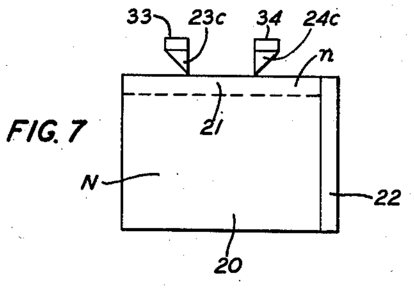
Fig. 7 is an elevational view of a translating device illustrative of another embodiment of this invention wherein PN junction type emitter and collector connections are utilized.

Figure 7 illustrates another embodiment of this invention wherein the emitter and collector connections to the zone 21 are established by chamfered or pointed bodies or stubs 23*c* and 24*c* of P conductivity type material. Connection to these bodies or stubs may be established by way of plated coatings 33 and 34 thereon.

Figure 8:
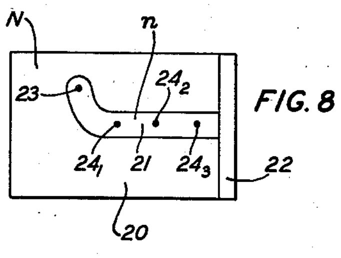
Fig. 8 is a plan view of a device illustrative of still another embodiment of this invention.

As illustrated in Fig. 8, the strip or zone 21 may be of other than rectilinear configuration, for example curved. Also, as illustrated in this figure a plurality of collectors $24_1$, $24_2$, and $24_3$ may be provided.

Figure 9:
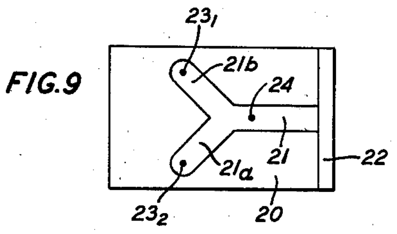
Figs. 9 and 10 are plan views of typical devices constructed in accordance with this invention including branched zones or channels.
Figure 10:
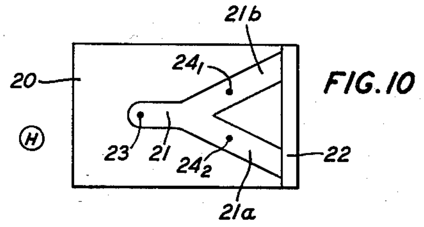

As illustrated in Figs. 9 and 10, the channel defining zones may be branched. Specifically, as shown in Fig. 9, the zone 21 may be Y-shaped with two emitters $23_1$ and $23_2$ bearing against the two arms and the collector 24 bearing against the stem. Thus, signals introduced at the emitter $23_1$ and $22_2$ may be mixed or one emitter may be utilized to control the amplification between the collector and the other emitter.

Conversely, as illustrated in Fig. 10, the collector end of the zone may be branched, that is, the emitter 23 bears against the stem of the Y-shaped zone and the two collector connections $24_1$ and $24_2$ are made to the arms 21*b* and 21*a*. By use of a magnetic field normal to the face of the zone, the field being indicated by the letter H in the drawing, carriers injected at the emitter 23 may be switched to either of the collectors $24_1$ or $24_2$ as in the manner disclosed in the application Serial No. 77,507 filed February 21, 1949, of R. L. Wallace, now Patent No. 2,553,490.

Figure 11:
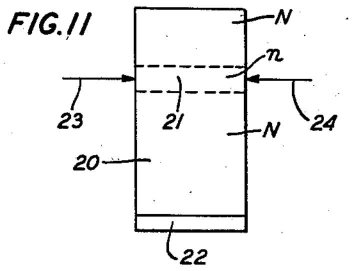
Figs. 11 and 12 are elevational views of devices illustrative of the embodiments of this invention wherein the emitter and collector bear against opposite faces of the semiconductive body.

The invention may be embodied also in devices of the general type disclosed in the application Serial No. 44,241 filed Aug. 14, 1948, of J. N. Shive wherein the emitter and collector bear against opposite faces of a semiconductive body. Specifically, as illustrated in Fig. 11, in one form the body 20, which may be circular or rectangular, has extending between opposite faces thereof a channel or zone 21 of conductivity lower than that of the body 20. The zone 21 may be of various cross-sectional configurations, for example, circular or rectangular. The emitter and collector 23 and 24, respectively, bear against opposite ends of the zone 21. The base connection 22 is made to the peripheral surface of the body 20.

Figure 12:
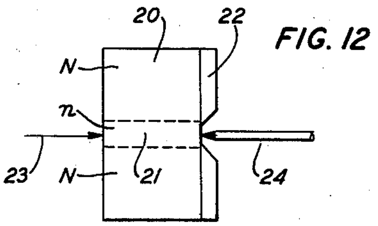

Alternatively, as illustrated in Fig. 12, the base connection 22 may be in the form of an annular coating upon one of the end faces of the body 20.

Although in the specific embodiments of the invention illustrated and described hereinabove the body has been shown of N conductivity type material and the zone 21 as of this same or different conductivity type, it will be appreciated that the invention may be practiced also in devices wherein the body 20 is of P conductivity type material and the zone 21 is of lower conductivity P type material or of N conductivity type material having therein but a small excess of donors. Of course, when the body is of P type material the polarities of biasing sources for the emitter and collector should be reversed from those shown in Figs. 1 and 4, that is so that the emitter is biased negative relative to the zone and the collector positive relative to the zone whereby a low emitter impedance and a high collector impedance are realized. In this case also the carriers injected into the zone at the emitter are electrons. Their flow is constrained to restricted paths by virtue of the energy contours at the junction of the zone and body in like manner to the concentration of the hole paths as described hereinabove.

It will be understood also that although specific embodiments of this invention have been shown and described they are but illustrative and that various modifications may be made therein without departing from the spirit and scope of this invention.

What is claimed is:

1. A signal translating device comprising a body of semiconductive material having therein a zone restricted in both transverse dimensions of conductivity substantially different from that of the remainder of said body, a base connection to said body, and emitter and collector connections to said zone.

2. A signal translating device in accordance with claim 1 wherein said body is of high conductivity N type material and said zone is of low conductivity N type material.

3. A signal translating device in accordance with claim 2 wherein said material is germanium.

4. A signal translating device in accordance with claim 2 wherein said material is silicon.

5. A signal translating device comprising a body of semiconductive material having in one face thereof a thin, narrow zone of conductivity substantially different from that of the portion of the body contiguous to said zone, spaced rectifying connections to said zone, and a substantially ohmic connection to said zone.

6. A signal translating device comprising a body of semiconductive material having in one face thereof a thin, narrow zone of conductivity substantially lower than that of the portions of the body bounding said zone, a base connection to said zone, and a pair of spaced point contacts bearing against said zone.

7. A signal translating device in accordance with claim 6 wherein said material is germanium.

8. A signal translating device in accordance with claim 6 wherein said material is silicon.

9. A signal translating device comprising a body of semiconductive material of one conductivity type having in one face portion thereof a thin, narrow zone of semiconductive material of the opposite conductivity type, a base connection to said body, an emitter connection to said zone, and a collector connection to said body in immediate proximity to a boundary of said zone.

10. A signal translating device in accordance with claim 9 wherein said body is of N conductivity type germanium and said zone is of P conductivity type germanium.

11. A signal translating device comprising a body of semiconductive material having extending between opposite faces thereof an internal, restricted zone of conductivity substantially different from that of the portions of said body contiguous to said zone, a base connection to said body, and emitter and collector connections to opposite ends of said zone.

12. A signal translating device comprising a body of semiconductive material having in one face thereof a thin Y-shaped zone of conductivity substantially different from that of the portions of the body contiguous to said zone, a base connection to said body, and a rectifying connection to each of the arms and stem of said zone.

13. A signal translating device comprising a body of semiconductive material of one conductivity type having in one face thereof a restricted zone of said material and conductivity type but of conductivity substantially different from that of the portion of said body contiguous to said zone, a base connection to said body, a pair of spaced regions in said zone of said material but of conductivity type opposite that of said zone, and individual substantially ohmic connections to said regions.

14. A signal translating device comprising a wedge-shaped body of semiconductive material of one conductivity type and having at the apex thereof a zone of said type but of conductivity different from that of the portion of said body contiguous therewith, a base connection to said body, and a pair of spaced rectifying connections to said zone.

15. A signal translating device comprising a body of N conductivity type germanium having a resistivity of the order of .01 ohm-centimeter, said body having in one face thereof a zone of the order of .001 inch thick and .001 inch wide of N conductivity type germanium having a resistivity of the order of 10 ohm-centimeters, a base connection to said body, and emitter and collector point contacts bearing against said zone.

WILLIAM G. PFANN.

REFERENCES CITED

The following references are of record in the file of this patent:

UNITED STATES PATENTS

| Number | Name | Date |
|---|---|---|
| 2,438,110 | Brittain | Mar. 23, 1948 |
| 2,476,323 | Rack | July 19, 1949 |
| 2,486,776 | Barney | Nov. 1, 1949 |
| 2,502,479 | Pearson | Apr. 4, 1950 |
| 2,561,411 | Pfann | July 24, 1951 |